(12) United States Patent
Boerner

(10) Patent No.: US 8,471,467 B2
(45) Date of Patent: Jun. 25, 2013

(54) ENCAPSULATED ELECTROLUMINESCENT DEVICE

(75) Inventor: Herbert Friedrich Boerner, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 13/147,019

(22) PCT Filed: Jan. 29, 2010

(86) PCT No.: PCT/IB2010/050402
§ 371 (c)(1),
(2), (4) Date: Jul. 29, 2011

(87) PCT Pub. No.: WO2010/089687
PCT Pub. Date: Aug. 12, 2010

(65) Prior Publication Data
US 2011/0285279 A1 Nov. 24, 2011

(30) Foreign Application Priority Data
Feb. 5, 2009 (EP) .................................. 09152171

(51) Int. Cl.
*H05B 33/04* (2006.01)
(52) U.S. Cl.
USPC ............................ 313/512; 445/25; 313/498
(58) Field of Classification Search
USPC ................ 313/498–512; 257/40, 72, 98–100, 257/642–643, 759; 427/58, 64, 66, 532–535, 427/539; 428/690–691, 917; 438/26–29, 438/34, 82, 455; 445/24–25; 315/169.1, 169.3
See application file for complete search history.

(56) References Cited

U.S. PATENT DOCUMENTS

| 2004/0075385 | A1 | 4/2004 | Tao | |
|---|---|---|---|---|
| 2006/0028133 | A1* | 2/2006 | Kondo et al. | 313/512 |
| 2006/0145596 | A1 | 7/2006 | Coe | |
| 2006/0170338 | A1* | 8/2006 | Masuichi et al. | 313/504 |
| 2007/0159096 | A1* | 7/2007 | Oh et al. | 313/512 |
| 2008/0003456 | A1 | 1/2008 | Epstein et al. | |
| 2008/0169750 | A1 | 7/2008 | Kim et al. | |
| 2009/0096371 | A1* | 4/2009 | Matsudate et al. | 313/505 |

FOREIGN PATENT DOCUMENTS

| EP | 1939952 A2 | 7/2008 |
|---|---|---|
| JP | 06290870 | 10/1994 |
| JP | 07192873 | 7/1995 |
| JP | 09148069 | 6/1997 |
| JP | 2006049853 A | 2/2006 |
| JP | 2007141645 A | 6/2007 |
| JP | 2007141646 A | 6/2007 |
| JP | 2007335105 | 12/2007 |
| WO | 2007025188 A1 | 3/2007 |

* cited by examiner

*Primary Examiner* — Donald Raleigh
(74) *Attorney, Agent, or Firm* — Mark L. Beloborodov

(57) ABSTRACT

This invention relates to an electroluminescent device (10) comprising an organic light emitting layer (50) and an encapsulation means (70) with a closed contour encapsulating the side of the electroluminescent layer stack (59) and for electrically contacting the counter electrode (40) to an electrical source. Furthermore, the invention relates to a method for providing such a device, the use of the contiguous contour as an encapsulation means and a covered substrate to be used in such a device.

20 Claims, 5 Drawing Sheets

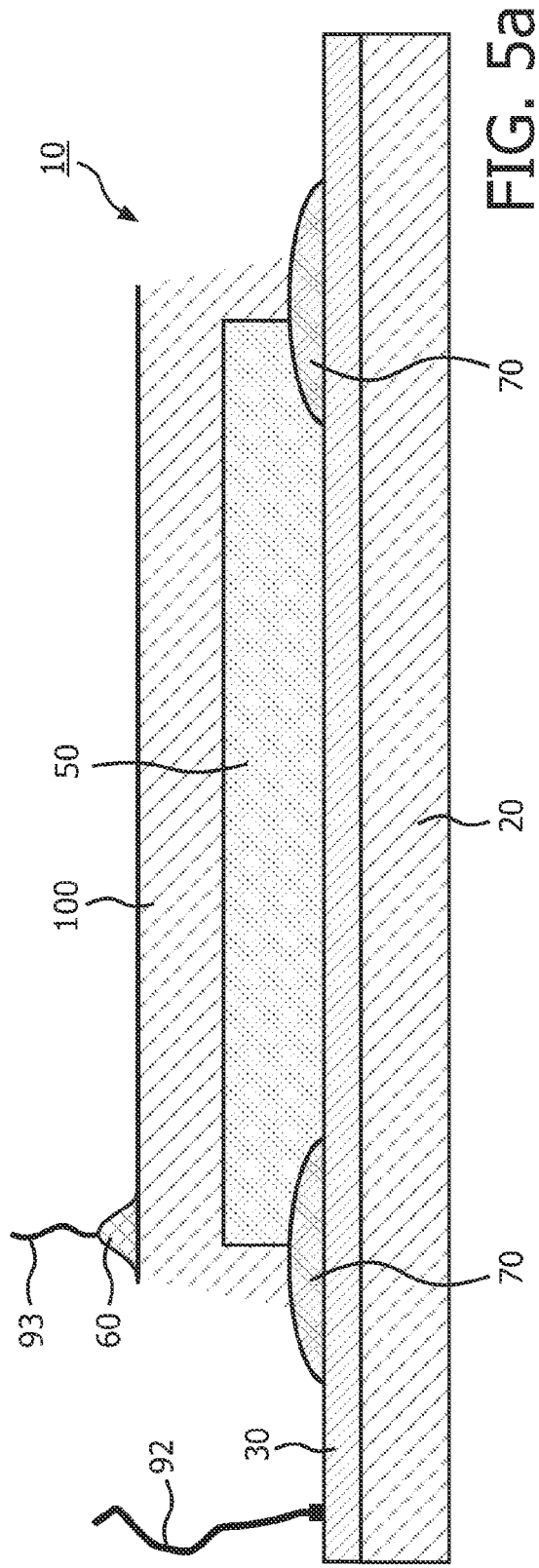
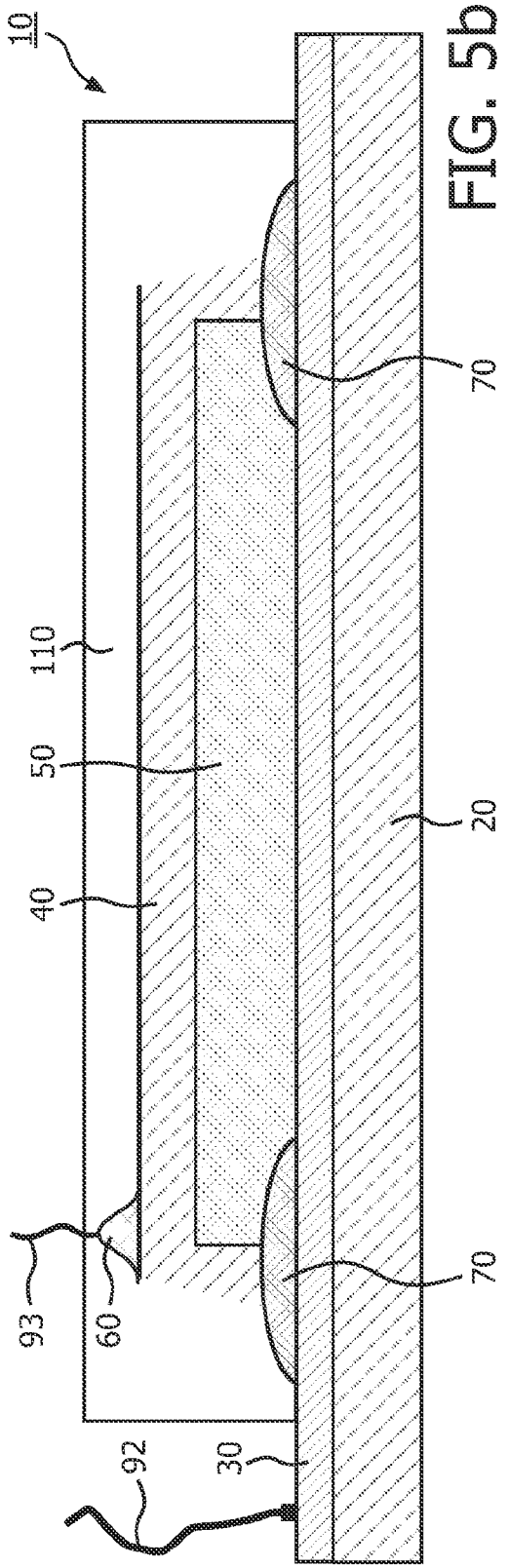

ENCAPSULATED ELECTROLUMINESCENT DEVICE

FIELD OF THE INVENTION

This invention relates to an electroluminescent device comprising an organic light emitting layer and an encapsulation means with a closed contour encapsulating the side of the electroluminescent layer stack and for electrically contacting the counter electrode to an electrical source. Furthermore, the invention relates to a method for providing such a device, the use of the contiguous contour as an encapsulation means and a covered substrate to be used in such a device.

BACKGROUND OF THE INVENTION

In the WO 2007/013 001 A2 an organic light emitting diode (OLED) is described. The organic light emitting diode consists of a thin layer of approximately 100 nm of organic substances, sandwiched between two electrodes. When a voltage—typically between 2 and 10 volts—is applied between the two electrodes, the organic substances emit light. Unfortunately, the organic layers and the counter electrode are very sensitive to oxygen and/or water. Therefore, the OLED is sealed with a side sealing and a flex foil on top of the side sealing as a cover lid defining a sealed volume with a gap between the substrate and the flex foil. One disadvantage of this device is the presence of such a gap. The gap has to be carefully filled with at least dry gases, preferably chemically inert gases. Furthermore, additional getters are commonly applied within the sealed volume to improve the device lifetime, especially in case of non-negligible oxygen and/or water diffusion rates through the sealing. Both increase the manufacturing effort. Additionally, the gap leads to an overall installation depth of the OLED device larger than desired. Therefore the avoidance of such a gap would be beneficial for the reasons mentioned above.

SUMMARY OF THE INVENTION

Thus, the invention has for its object to eliminate the above mentioned disadvantages. In particular, it is an object of the invention to provide an electroluminescent device with a side encapsulation avoiding a gap between substrate and backside of the electroluminescent device, where the said electroluminescent device is suitable to easily be connected without the danger of a short.

This object is achieved by an electroluminescent device comprising a substrate and on top of the substrate a substrate electrode, a counter electrode and an electroluminescent layer stack with at least one organic electroluminescent layer to emit light arranged between the substrate and the counter electrode and an electrically non-conducting encapsulation means arranged on the substrate electrode as a closed contour having an inner edge and an outer edge framing the electroluminescent layer stack, wherein the electroluminescent layer stack at least fully covers the area on top of the substrate electrode defined by the inner edge of the contour and establishing a contiguous first gap between the outer edge of the contour and the edge of the electroluminescent layer stack, and wherein the counter electrode fully covers the electroluminescent layer stack establishing a contiguous second gap between the outer edge of the contour and the edge of the counter electrode smaller than the first gap and sufficiently large to isolate the counter electrode from the substrate electrode, wherein the encapsulation means is suitable to act as a diffusion barrier layer in order to provide a side encapsulation of the electroluminescent layer stack.

The leading idea of the present invention is to use an encapsulating means to effectively seal the side of the electroluminescent layers stack without providing any gap between the substrate and the backside of the electroluminescent device in order to provide sufficient electroluminescent device life-times. Furthermore, getters are obsolete in the electroluminescent device according to our present invention. Here, a simple and universal way to seal also the side of the electroluminescent layer in all places is disclosed leading to a considerably cheaper production of electroluminescent OLED devices. The encapsulation means simultaneously improves the reliability of the electroluminescent device by preventing a short between the counter electrode and the substrate electrode. Preferably the electroluminescent device can be easily contacted to a power source avoiding the necessity of structuring the substrate electrode by providing an area, which is the encapsulation means, to establish an electrical connection between the counter electrode to a power source using a three dimensional contacting scheme.

In the context of the invention the notion electroluminescent (EL) layer stack denotes all layers prepared between the substrate electrode and the counter electrodes. In one embodiment of an EL layer stack, it comprises at least one light emitting organic electroluminescent layer prepared between substrate and counter electrode. In other embodiments the layer stacks may comprise several layers prepared between substrate and counter electrode. The several layers may be organic layers, such as one or more hole transport layers, electron blocking layers, electron transport layers, hole blocking layers, emitter layers or a combination of organic and non-organic layers. The non-organic layers may be additional electrodes in case of two or more light emitting layers within the layer stack and/or charge injection layers. In a preferred embodiment the substrate electrode and or the counter electrode comprise at least one of the following materials: ITO, aluminum, silver, doped ZnO or an oxide layer.

In the context of the invention the notion substrate denotes a base material onto which the different layers of an electroluminescent device are deposited. Normally, the substrate is transparent and is made of glass. Furthermore, it may be preferable that the substrate is transparent, preferably comprising at least one of the following materials: silver, gold, glasses or ceramics. It may also be a transparent polymer sheets or foils with a suitable moisture and oxygen barrier to essentially prevent moisture and/or oxygen entering the electroluminescent device layer stack. It is also possible to use non-transparent materials like metal foils as substrate. The substrate may comprise further layers, e.g. for optical purposes like light out-coupling enhancement or other purposes. The substrate is usually flat, but it may also be shaped into any three-dimensional shape that is desired.

In the context of the invention the notion substrate electrode denotes an electrode deposited on top of the substrate. Usually it consists of transparent ITO (Indium-Tin oxide) optionally with an undercoating of $SiO_2$ or SiO to suppress diffusion of mobile atoms or ions from the glass into the electrode. For a glass substrate with an ITO electrode, the ITO is usually the anode, but in special cases it can also be used as the cathode. In some cases, thin Ag or Au layers (8-15 nm thick) are used single or in combination with ITO as the substrate electrode. If a metal foil is used as the substrate, it takes also the role of the substrate electrode, either anode or cathode.

The notation on-top-of denotes the sequence of the listed layers. This notation explicitly comprises the possibility of further layers in between the layer denoted as on top of each other. For example, there might be additional optical layers to enhance the light out-coupling arranged between substrate electrode and substrate. The notation covering denotes that a first layer is deposited on top of a second layer extending the outermost edge of the second layer if the first layer is called as covering the second layer. A stack of layers, where a first layer covers a second layer may comprise additional layers in between the first and second layer or underneath the second layer.

In the context of the invention the notion counter electrode denotes an electrode away from the substrate. It is usually non-transparent and made of Al or Ag layers of sufficient thickness such that the electrode is reflecting (typically 100 nm for Al and 100-200 nm for Ag). It is usually the cathode, but it can also be biased as the anode. For top-emitting or transparent electroluminescent devices the counter electrode has to be transparent. Transparent counter electrodes are made of thin Ag or Al layers (5-15 nm) or of ITO layers deposited on top of the other previously deposited layers. To ensure a sufficient diffusion barrier through the counter electrode, the thickness of the counter electrode is preferably larger than the thickness of the electroluminescent layer stack.

In the context of the invention an electroluminescent device with a combination of a transparent substrate, a transparent substrate electrode and a non-transparent counter electrode (usually reflective), emitting the light through the substrate is called "bottom-emitting". In case of electroluminescent device comprising further electrodes, in certain embodiments both substrate and counter electrodes could be either both anodes or both cathodes, when the inner electrodes as driven as cathodes or anodes. Furthermore, in the context of the invention an electroluminescent device with a combination of a non-transparent substrate electrode and a transparent counter electrode, emitting the light through the counter electrode is called "top-emitting".

In the context of the invention the notion transparent electroluminescent device denotes an electroluminescent device, where the substrate, the substrate electrode, the counter electrode and eventually additionally applied layers on top of the counter electrode such as diffusion barriers are transparent. Here the electroluminescent device is both, bottom- and top-emitting. In the context of the invention a layer, a substrate or an electrode is called transparent if the transmission of light in the visible range is more than 50%; the rest being absorbed or reflected. Furthermore, in the context of the invention a layer, substrate or electrode is called semi-transparent if the transmission of light in the visible range is between 10% and 50%; the rest being absorbed or reflected. In addition, in the context of the invention light is called visible light, when it possesses a wavelength between 450 nm and 650 nm. In the context of the invention light is called artificial light, when it is emitted by the organic electroluminescent layer of the electroluminescent device.

Furthermore, in the context of the invention a layer, a means, a connector or a construction element of an electroluminescent device is called electrically conducting if its electrical resistance is less than 100000 Ohm. Otherwise it is called non-conducting. In the context of the invention passive electronic components comprise resistors, capacitors and inductivities. Furthermore, in the context of the invention active electronic components comprise diodes, transistors and all types of integrated circuits.

In the context of the invention a layer, a means, a substrate, an electrode or a construction element of an electroluminescent device is called reflective if light incident on its interface is returned according to the law of reflection: the macroscopic angle of incidence equals the macroscopic angle of reflection. Also the term specular reflection is used in this case. Furthermore, in the context of the invention a layer, a means, a substrate, an electrode or a construction element of an electroluminescent device is called scattering if light incident on it is not returned according to the law of reflection: macroscopic angle of incidence is not equal to the macroscopic angle of the returned light. There is also a distribution of angles for the returned light. Instead of scattering, the term diffuse reflection is also used.

The notation backside of the electroluminescent device denotes the outermost layer facing away from the substrate required to sufficiently seal the electroluminescent device in order to provide a sufficient life-time of the electroluminescent device.

Oxygen or water may damage the organic electroluminescent layer or the counter electrode. As the encapsulation means have direct contact with the organic electroluminescent layer, it is preferred, that the encapsulation means is anhydrous and/or water free. In the context of the invention, the notion water free and/or anhydrous describes the fact, that no degradation due to water content during the average life-time of an electroluminescent device can be observed by the naked eye. A visible degradation of the electroluminescent layer stack and/or the counter electrode due to water diffusing into the stack of layers can take the form of growing black spots or shrinkage of the emissive region from the edges. The notion water free and/or anhydrous not only depends on the non-conductive glue itself but also on the amount of water, which can be absorbed by the electroluminescent layer stack and/or the counter electrode without damaging it.

In the context of the invention layers and/or means are denoted as diffusion barriers if the layers and/or means prevent harmful diffusion of moisture and/or oxygen into the electroluminescent layer stack or counter electrode. A diffusion is denoted as harmful if a significant life-time reduction of the emitted light can be observed. Standard electroluminescent (OLED) devices according to state of the art achieve shelf life times in the order of 100000 hours or more. A significant reduction denotes a reduced life-time of about a factor of 2 or more. The contour of the encapsulating means should have a width of 0.5 mm, preferably 1.0 mm, more preferred 2.0 mm in order to prevent a harmful diffusion from the into the side of the electroluminescent layer and/or the counter electrode.

The encapsulation means is electrically not conductive. In order to ensure an isolation between substrate electrode and counter electrode, the thickness of the encapsulation means should be more than 20 nm, preferably more than 100 nm, more preferred more than 200 nm.

In an embodiment the encapsulation means comprises at least one material of the group of materials of SiO, $SiO_2$, $TiO_2$, nitrides, preferably SiN, fluorides, preferably $CaF_2$, glass, re-melted glass frits, UHV lacquer, oxidized metal, preferably anodized Aluminum. The listed materials are water free and/or anhydrous, suitable to provide a sufficient diffusion barrier to enable state of the art life times and able to be deposited with common deposition techniques.

In another embodiment a smoothing layer is arranged on top of the substrate electrode at least covering the inner edge of the contour to smooth the inner edge of the contour. The presence of a smoothing layer prevents the emergence of any shadowing edge for the following deposition processes of electroluminescent layer stack and counter electrode. Shadowing edges have to be avoided in order to achieve continuous layers without defects such as cracks. The material property of the material of the smoothing layer smoothly covering the inner edge of the contour to avoid showing effects is the viscosity, e.g. the viscosity at enhanced temperature. Preferably the viscosity of the material of the smoothing layer is low at the deposition temperature and/or at the temperature applied to the smoothing layer during a later process step. The material of the smoothing layer can be any suitable material, preferably a non-conductive material.

In a preferred embodiment the smoothing layer is arranged at the inner edge of the contour as a rim with a width smaller than the width of the encapsulation means in direction parallel to the substrate electrode. The visibility of the additional non self emitting area, where the smoothing layer as a rim is present can be reduced or even avoided if scattering particles are added to the material of the smoothing layer in order to scatter the light entering the smoothing layer towards the substrate.

The smoothing layer may comprise at least one material, preferably an electrically non-conductive material, of the group of materials of glue, polymer, lacquer, paint, ink, which are easy to apply, e.g. with printing. In order to prevent any affect to the life time of the electroluminescent device, these materials preferably are anhydrous and/or water free. For example, if a glue comprising at least one of the following materials epoxy, polyurethane, acrylic or silicon is used as the material for the smoothing layer it may be applied like a drop onto the substrate electrode at the inner edge of the contour. The low viscosity of the glue enables the glue to flow into the edge smoothing out any steep edge at the inner edge of the contour preventing any shadowing effect during deposition of the subsequent layers.

To achieve a lasting non-conductive glue at least one of the following matrices may be used: epoxys, polyurethanes, acrylic or silicone. A smoothing layer as a rim may comprise non-conductive material. This non-conductive material may be transparent, opaque or comprise scattering properties. Depending on the material used for the smoothing layer as a rim, experiments have shown that the area to which the smoothing layer is applied may appear dark at normal operation of the electroluminescent device, since direct current injection from the substrate electrode to the electroluminescent layer is blocked. Therefore, another preferred embodiment is characterized in that the smoothing layer as a rim comprises at least one scattering means, for scattering light generated by the organic electroluminescent layer; preferably that the scattering means is embedded in the smoothing layer. This scattering means scatters and or reflects part of the artificial light guided by the substrate. This results in a brightening of the otherwise non-emissive rim area. As the substrate often works as a kind of light guide, the scattering means of the smoothing layer as a rim enables this light to be scattered and reflected out of the electroluminescent device. The scattering means may be formed by a plurality of pigments and/or flakes embedded in the protective means. This pigments and/or flakes may for example comprise: aluminum, mica effect pigments, titan dioxide particles or other flakes or particles known to a person skilled in the art as scattering and/or reflecting the artificial light of the electroluminescent device. In another preferred embodiment the smoothing layer is dyed. This may be done by coloring the smoothing layer itself or by applying colored pigments to the smoothing layer.

In another embodiment at least one contact means is arranged on top of the encapsulation means at a location where the encapsulation means is at least partly covered with the counter electrode in order to establish an electrical connection between the counter electrode and a power source. In state of the art OLEDs, the electrode on the substrate is at least structured into two electrically separate regions: one serving as the substrate electrode and the other one connected to the counter electrode. Thus both the substrate and the counter electrode are led in one plane to the rim of the substrate, where they can be contacted by standard means. The disadvantage of this 2-dimensional contacting scheme is that the substrate electrode as well as the counter electrode have to share the periphery of the OLED for contacting, so that the electrode on the substrate needs to be divided into at least two disjoint regions (substrate electrode and second electrode to be contacted with the counter electrode) to avoid shorting the device. The disclosed 3-dimensional contacting eliminates this serious disadvantage of the 2-dimensional contacting.

A contact means applied to the counter electrode without the encapsulating means underneath the contact means may damage the counter electrode, which may penetrate through the electroluminescent layer stack getting into direct contact with the substrate electrode creating a short. To avoid this, the contact means is arranged on top of the encapsulation means preventing any direct contact between counter electrode and substrate electrode. The contact means can easily be connected to an electrical source, as no special considerations concerning the contact means have to be made. Even if the contacting is done in a way that the contact means damages the counter electrode, there is no risk of a short as the encapsulation means will prevent any direct contact between the contact means or the counter electrode and the substrate electrode. To achieve this aim, the contact means is arranged fully above the encapsulation means, which may exceed the area of the contact means. Furthermore, the material of the encapsulation means must be thick and/or hard enough to shield the substrate electrode from the contact means. The precise thickness and hardness depend on the actual pressure exerted by the contact means, but typically 1-100 micrometer thickness are sufficient. For example, the desired protection has been achieved with encapsulation means of 1.5 micrometer thickness as well as with encapsulation means of 10-200 micrometer thickness, but also thicker encapsulation means can be used. The contact means may comprise a spring, which is placed between a holder/housing of the electroluminescent device and the counter electrode. This spring may therefore be in direct contact with the counter electrode and conduct electrical current to the counter electrode. The spring may be attached to the counter electrode, e.g. by soldering, laser welding or ultrasonic welding. The attachment process may lead to a penetration of the counter electrode and/or the electroluminescent layer stack. Again the encapsulation means below would prevent a short. In another embodiment the spring may press a coin-like contact plate to the counter electrode. Even if the surface of this coin-like element may penetrate parts of the counter electrode, no short will occur as the encapsulation means below will prevent that the surface of the contact means gets into electrical contact with the substrate electrode. In another preferred embodiment the contact means may comprise an arc-shaped spring. The arc-like shaped spring can easily be attached to the encapsulation means and the contact between the contact means and the counter electrode is easily established. In another preferred embodiment, the contact means is a rounded tip. It may also comprise a spring, which presses the rounded tip onto the counter electrode. Due to the large area of contact between the rounded tip and the counter electrode a reliable contact is established.

In another embodiment the contact means comprises at least one material of the group of materials of conductive glue, conductive lacquer, conductive paint, conductive ink. Suitable conductive materials for the contact means are already disclosed as suitable materials for the conductive smoothing layer, applicable as conductive means as well. These contact means can be applied to the counter electrode for instance with a printing and/or painting process without exerting locally high pressure on the counter electrode. Therefore there is no risk that a short between the counter electrode and the substrate electrode is even more reduced enabling the application of encapsulation means with a lower thickness compared the case where mechanical contact means should be applied as disclosed previously.

A common counter electrode as evaporated is only completely gas-tight in absence of any pin hole within the counter electrode. In a preferred embodiment the counter electrode is suitable to be thickened, preferably via an electroplating process, more preferred the counter electrode is made of Aluminum. Electroplating is a suitable process to strongly increase the thickness of the counter electrode, as an example up to the micrometer range. Such a thick layer would be sufficient to act as a diffusion barrier in the context of the present invention even in case of present pin holes in the initial counter electrode before thickening. The eventually present pin holes will be closed during the thickness increasing electroplating process. In preferable embodiment the counter electrode is made of Aluminum known as a suitable material for electroplating processes. In the cases above, the counter electrode is reflective and therefore not-transparent. In order to isolate the counter electrode electrically from the environment additional non-conducting inorganic and/or organic layers have to be deposited on top of the counter electrode to fully cover the counter electrode. People skilled in the art are able to choose suitable materials to prepare such additional layer. These layer(s) may be added before or after applying a contact means to the counter electrode. Depending on the kind of contact means, the contact means have to be kept free from the further additional layers in order to establish an electrical contact to the power source later on. In case of protruding contact means, the additional layer(s) may be deposited on top of the counter electrode without additional measures to keep the contact means free. For example, the contact means may be any conductive glue with attached wire. There is no need to keep the wire free of additional layers to be able to contact the counter electrode via contact means and wire to the power source. However, such an electroluminescent device is operated as a bottom-emitting device.

In an alternative embodiment the counter electrode is encapsulated with a diffusion barrier, preferably a thin film diffusion barrier to ensure a sufficient encapsulation of the electroluminescent device to guarantee a state of the art lifetime. Layers or layer stacks suitable to act as diffusion barriers, preferably as thin film diffusion barriers, are for example layers and/or layer stacks comprising silicon oxide, silicon nitride. People skilled in the art may choose also alternative materials within the scope of this invention. Also thin getter layers may be sandwiched in between these layer stacks to further improve the diffusion barrier properties of such layer and/or layer stacks. In this case, the counter electrode could be either transparent or non-transparent. Depending on the optical properties of the diffusion barrier (transparent or non-transparent) the electroluminescent device can be operated either as a bottom-emitting device or a top-emitting device or as a transparent electroluminescent device. The resulting encapsulation is a reliable seal for the electroluminescent device from the backside in addition to the reliable seal from the side of the electroluminescent device simultaneously reducing the overall installation depth of the electroluminescent device. Depending on the kind of contact means, also in this case the contact means have to be kept free from the deposited diffusion barrier in order to establish an electrical contact to the power source later on. In case of protruding contact means, the diffusion barrier may be deposited on top of the counter electrode without additional measures to keep the contact means free. For example, the contact means may be any conductive glue with attached wire, there is no need to keep the wire free of the diffusion barrier to be able to contact the counter electrode via contact means and wire to the power source.

This invention further relates to a method to provide an electroluminescent device according to our present invention comprising the steps of depositing a substrate electrode on top of a substrate, depositing a closed contour with an inner edge and an outer edges as an encapsulation means on top of the substrate electrode, depositing an electroluminescent layer stack on top of the substrate electrode fully covering the area on top of the substrate electrode defined by the inner edge of the contour and establishing a contiguous first gap between the outer edge of the contour and the edge of the electroluminescent layer stack, and depositing a counter electrode fully covering the electroluminescent layer stack establishing a contiguous second gap between the outer edge of the contour and the edge of the counter electrode smaller than the first gap isolating the counter electrode from the substrate electrode.

The preferred deposition technology for the substrate electrode is evaporating or sputtering, for the electroluminescent layer stack and the counter electrode the preferred deposition technology is vacuum evaporation. Vacuum evaporation and sputtering are deposition technologies, where the materials to be deposited follow a straight path from the evaporation source to the substrate, leading to a directed deposition. If the encapsulation means has steep edges or overhanging edges, shadowing effects will occur, which lead to holes in the electroluminescent layer stack and the counter electrode. To prevent this undesirable effect, it is preferable that the encapsulation means has smooth and non-steep edges. Therefore, the invention also claims an encapsulation means comprising material properties and/or application procedures that prevents the emergence of a shadowing edge on a substrate electrode. In a preferred embodiment the material property preventing the emergence of a shadowing edge is the viscosity, e.g. the viscosity at enhanced temperature. Preferably the viscosity is low. If the encapsulation means exhibit a viscosity that enables it to flow, a smooth hill-like shape of the encapsulation means will result, which prevents shadowing effects. If a material is used for the encapsulation means that gives rise to steep edges that may create shadowing effects if only one deposition source is used, several deposition sources could be used to deposit material from different directions onto the substrate. It may also be advisable to rotate or otherwise move the substrate during deposition to ensure a continuous layers deposition to partly cover the encapsulation means without emergence of shadowing effects. Suitable materials for the encapsulation means can be deposited by vacuum evaporation, sputtering, chemical vapor deposition, plasma enhanced chemical vapor deposition, atomic layer deposition or other processes chosen by people skilled in the art within the scope of this invention. As an example for an encapsulation layer, Schott #8329 glass can be evaporated, sputtered or applied as a frit in form of a powder or a paste, which is then re-melted in an oven or by a laser or by another heating method.

In another embodiment the method further comprises the step of depositing a smoothing layer on top of the substrate electrode at least covering the inner edge of the contour to smooth the inner edge of the contour, preferably at the inner edge of the contour as a rim with a width smaller than the width of the encapsulation means in direction parallel to the substrate electrode after depositing the encapsulation means. Applying a smoothing layer avoids the necessity to avoid shapes of the encapsulation means leading to showing edges. The present shadowing edges at the inner edge of the encapsulation means can be smoothed out by the smoothing layer with material properties avoiding shapes leading to showing edges. The outer edge of the encapsulation means has no restrictions to a certain shape, because the outer edge of the encapsulation means will not be coated with the electroluminescent layer and the counter electrode.

In another embodiment the method further comprises the step of applying a contact means on top of the encapsulation means at a location where the encapsulation means was previously at least partly covered with the counter electrode. The contact means can be applied for instance with a printing and/or painting process without exerting locally high pressure on the counter electrode. Therefore there is no risk that a short between the counter electrode and the substrate electrode develops during application of the glue. Even if the contact means is applied in a way that the contact means damages the counter electrode, there is no risk of a short as the encapsulation means will prevent any direct contact between the contact means or the counter electrode and the substrate electrode. The contact means may comprise a spring, which is placed between the holder/housing of the electroluminescent device and the counter electrode. This spring may therefore be in direct contact with the counter electrode and conduct electrical current from the encapsulation means to the counter electrode. The spring may be attached to the counter electrode, e.g. by soldering, laser welding or ultrasonic welding. The attachment process may lead to a penetration of the counter electrode and/or the electroluminescent layer stack. Again the encapsulation means below would prevent a short. In another embodiment the spring may press a coin-like contact plate to the counter electrode. Even if the surface of this coin-like element may not be perfectly flat, but penetrates parts of the counter electrode, no short will occur as the encapsulation means below will prevent that the surface of the contact means gets into electrical contact with the substrate electrode. In another preferred embodiment the contact means may comprise an arc-shaped spring. The arc-like shaped spring can easily be attached to the encapsulation means and the contact between the contact means and the counter electrode is easily established. In another preferred embodiment, the contact means is a rounded tip. It may also comprise a spring, which presses the rounded tip onto the counter electrode. Due to the large area of contact between the rounded tip and the counter electrode a reliable contact is established. This kind of contacting the counter electrode has the advantage that a three-dimensional contact schema is applied achieving average life-times of standard OLEDs by reducing the risk of shorts. No special considerations concerning the contact means have to be made.

In another embodiment the method further comprising the step of strengthen the encapsulation properties of counter electrode by thickening the counter electrode or applying additional diffusion barriers on top of the counter electrode. As an example a electroplating process can be applied in order to thicken the counter electrode, preferably made of Aluminum, or additional layers suitable to prevent a diffusion can be applied on top of the counter electrode.

The invention further relates to a use of a closed contour arranged on a substrate electrode on top of a substrate framing an electroluminescent layer stack arranged on the substrate electrode to act as a encapsulation means for the side of the electroluminescent layer, to isolate the substrate electrode from a counter electrode on top of the electroluminescent layers tack, and to enabling a contacting of the counter electrode with contact means on top of the closed contour.

The invention further relates to a substrate covered by only one contiguous electrode to be used as the substrate electrode in an electroluminescent device according to our present invention and an electrically non-conducting encapsulation means arranged on the substrate electrode as a closed contour. The contiguous electrode is not structured denoting any electrode, where the substrate area coated with the electrode to be the substrate electrode is not adapted to apply a second conductive area onto the substrate within the encapsulated area of the substrate area of an organic electroluminescent device covered by an encapsulation means, which is electrically isolated to the substrate electrode.

Features and details described with respect to the electroluminescent device also apply to the method and vice versa. The aforementioned electroluminescent device and/or method, as well as claimed components and the components to be used in accordance with the invention in the described embodiments are not subject to any special exceptions with respect to size, shape, material selection. Technical concepts such that the selection criteria are known in the pertinent field can be applied without limitations. Additional details, characteristics and advantages of the object of the present invention are disclosed in the dependent claims and the following description of the respective figures—which are an exemplary fashion only—showing a plurality of preferred embodiments of the electroluminescent device according to the present invention.

BRIEF DESCRIPTION OF THE DRAWING

FIG. 5: electroluminescent device of FIG. 1 with (a) thickened counter electrode, and (b) with additional diffusion barrier on top of the counter electrode

DETAILED DESCRIPTION OF EMBODIMENTS

Figure 1:
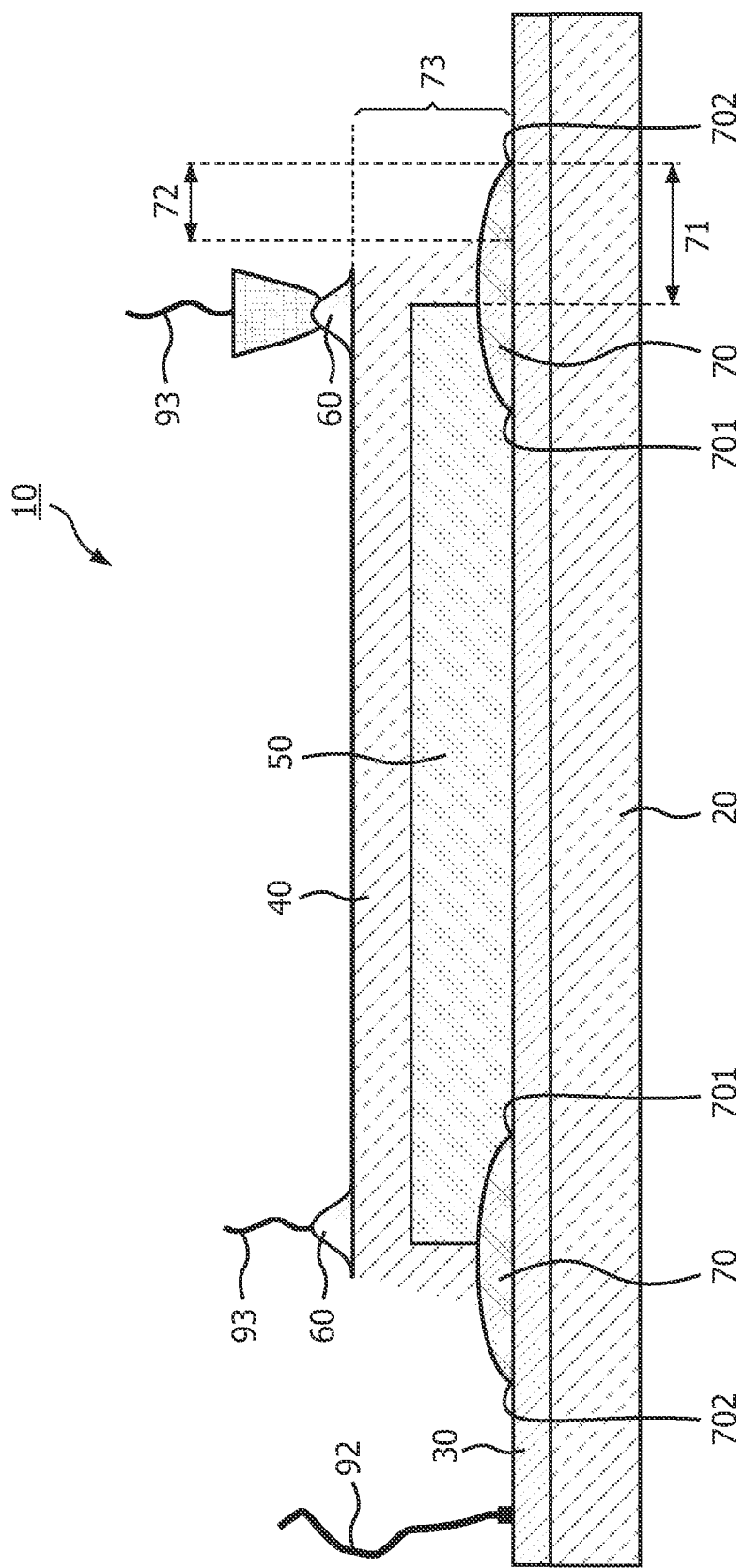
FIG. 1: electroluminescent device according to the present invention in a side view

In FIG. 1 an electroluminescent device 10 according to the present invention is shown. The electroluminescent device comprises a substrate 20, a substrate electrode 30, a counter electrode 40 and an organic electroluminescent layer 50 as the electroluminescent layer stack in this and the following examples. The organic electroluminescent layer 50 is arranged between the substrate electrode 30 and the counter electrode 40 forming a layer stack. This layer stack is arranged on top of the substrate 20. In the shown embodiment the substrate electrode 30 is formed by an approximately 100 nm thick layer of ITO, which is a transparent and conductive material. Onto this substrate electrode 30 the organic electroluminescent layer 50 is deposited. If a voltage is applied between the substrate electrode 30 and the counter electrode 40 some of the organic molecules within the organic electroluminescent layer 50 are exited, resulting in the emission of artificial light, which is emitted by the electroluminescent layer 50. The counter electrode 40 is formed by a layer of aluminum, working as a mirror reflecting the artificial light through the substrate electrode 30 and the substrate 20. To emit light into the surrounding, the substrate 20 in this embodiment is made of glass. Thus, the electroluminescence device according to FIG. 1 is a bottom emitting OLED. The electroluminescence device 10 shown in the following figures as well as its components and the components used in accordance with the invention are not shown true to the scale. Especially the thickness of the electrodes 30, 40, organic electroluminescence layer 50 and substrate 20 are not true to the scale. All figures just serve to clarify the invention.

As can be seen in FIG. 1 an encapsulation means 70 is arranged as a closed contour (see FIG. 2 as a reference for the closed contour) with an inner edge 701 and an outer edge 702 on top of the substrate electrode 30. The encapsulation means 70 and the counter electrode 40 covering the organic electroluminescent layer 50 build a side encapsulation 73 for the electroluminescent device 10, where the counter electrode 40 fully covers the organic electroluminescent layer 50 establishing a contiguous second gap 72 between the edge of the counter electrode 40 and the outer edge of the closed contour of the encapsulation means 70. Since there is no direct contact between counter electrode 40 and substrate electrode 30 and the encapsulation means is made of electrically non-conducting material, both electrodes 30, 40 are isolated against each other. The organic electroluminescent layer 50 fully covers the substrate electrode 30 inside the closed contour and extend partly on top of the encapsulation means 70 forming a contiguous first gap 71 between the edge of the organic electroluminescent layer 50 and the outer edge 702 of the closed contour of the encapsulation means 70. A substrate electrode fully covered by the electroluminescent layer stack is required to prevent a direct contact of counter electrode 40 with substrate electrode 30 within the inner area defined by the inner edge of closed contour of the encapsulation means 70. The side encapsulation 73 comprising the encapsulation means 70 and the counter electrode 40 on top of the encapsulation means 70 has to be gas-tight to prevent ambient atmosphere from damaging the organic electroluminescent layer 50 or any of the two electrodes 30, 40. The counter electrode 40 with a thickness of more than 100 nm will act as a sufficient diffusion barrier against the environment on the backside of the electroluminescent device if the counter electrode 40 is prepared without pin holes or other layer defects enabling oxygen and/or water getting into contact with the electroluminescent layer stack 50. If the counter electrode as prepared by the vacuum evaporation process has pinholes, it has to be thickened sufficiently that all the pinholes are closed. This is usually the case when it its thicker than 10 μm. The shown electroluminescent device 10 does not require a getter or a cover lid anymore leading to a reduction of the number of required components and therefore the production costs. Simultaneously the overall installation depth could be reduced compared to state of the art OLEDs with cover lids.

In order to apply an operating voltage to the electroluminescent device 10, the substrate electrode 30 is connected to a electrical power source (not shown here) via the electrical connection 92. Furthermore, the electroluminescent device 10 comprises at least one contact means 60, for electrically contacting the counter electrode 40 to the electrical power source. The contact means 60 is therefore a part of the path 93 leading from the counter electrode 30 to the electrical source. In the known prior art contact posts are used as contact means, which are applied to the counter electrode 30. Such contact posts have the disadvantage that they are mechanically applied to the counter electrode and often lead to shorts between the counter electrode 30 and the substrate electrode 20. To overcome this disadvantage the invention discloses that the contact means 60 is applied at an area of the counter electrode 40, where a protection layer is located fully below the contact area of the counter electrode. This protection layer is provided by the encapsulation means 70. The area of the substrate electrode 30 below the contact means 60 covered by the encapsulation means 70 (protective area) exceeds the area on the counter electrode 40 being in contact with the contact means 60 (contact area). As one example of a contact means 60, a dot of conductive glue is shown in FIG. 1 on the left hand side, where a wire 93 is attached to. The wire can be connected to said power source. Another example of a contact means is shown on the right hand side of FIG. 1, where a round metal tip is pressed into a dot of conductive glue and connected to the power source via a wire 93. People skilled in the art may choose other contact means such as. Conductive glue can be applied in a gentle manner to the counter electrode 40. Even if the contact means 60 are provided as mechanical means like tips, springs or the like penetrating the counter electrode 30 and the organic electroluminescent layer 50 there would be no short, because the material of the encapsulation means is sufficiently hard and/or sufficiently thick to prevent the substrate electrode 30 to get into contact with the contact means and/or parts of the counter electrode 40.

Figure 2:
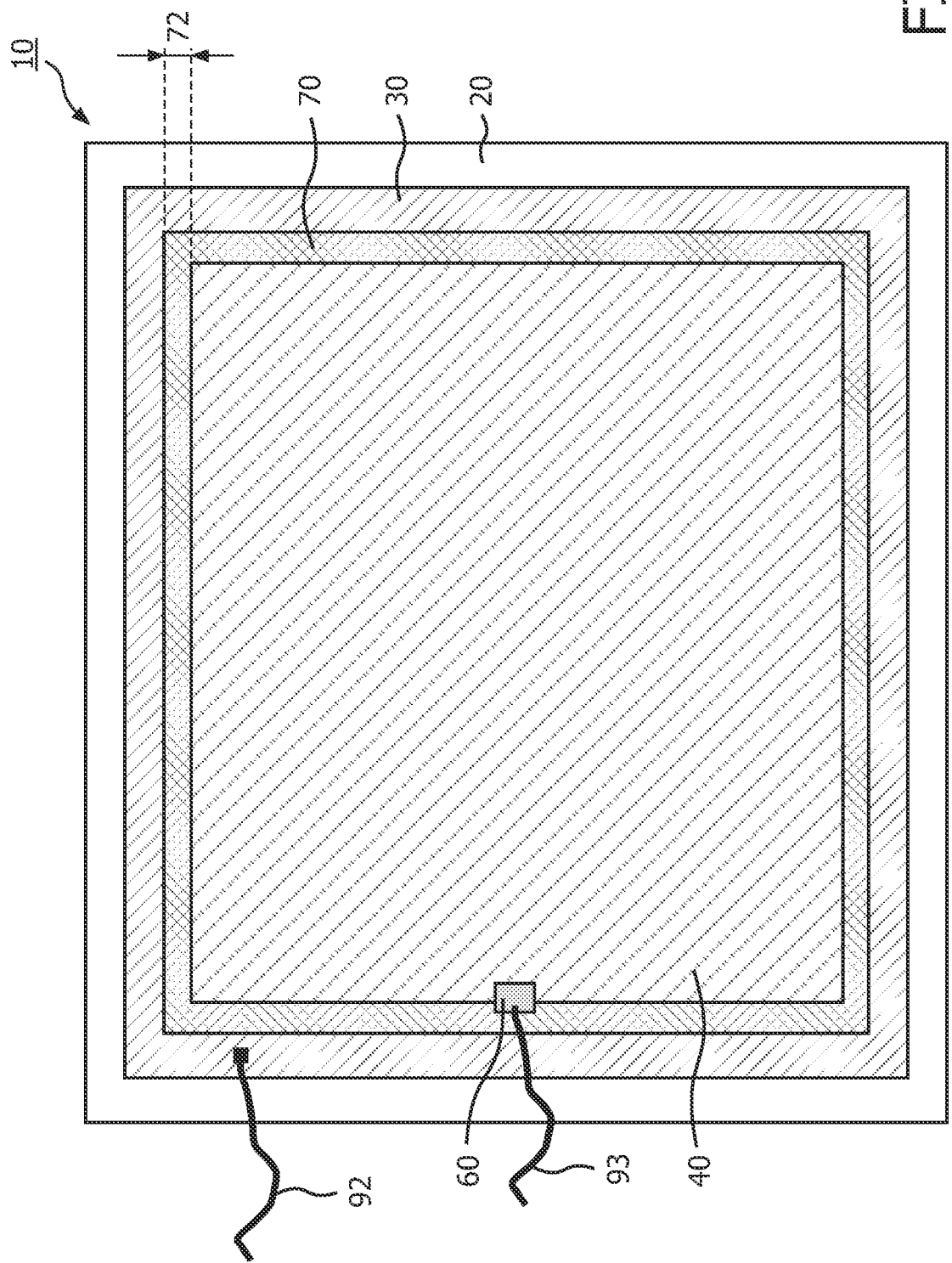
FIG. 2: electroluminescent device according to the present invention in a top view

The FIG. 2 shows a top view on the backside of the electroluminescent device 10 according to FIG. 1. Therefore, the view is mostly directed onto the counter electrode 40 partly covering the encapsulation means 70 defining a contiguous second gap 72 between the edge of the counter electrode and the outer edge 702 of the contour of the encapsulation means 70. The substrate electrode 30 extends over the area of encapsulation means and counter electrode in order to enable an easy contacting of the substrate electrode 30 with a power source via a conductive path 92. In this example the area of the substrate 20 further exceeds the area of the substrate electrode, which areas could be equal in alternative embodiments. In FIG. 2 a single contact means 60 is applied to the counter electrode 40 located above the area of the encapsulation means 70 (only partly seen here). A conductive path 93 establish the connection of the counter electrode to the power source. Current has to flow from the substrate electrode 30 through the organic electroluminescent layer 50 into the counter electrode 40 and finally through the contact means 60 back to the electrical source. As the resistance of a very thin layer of metal like the substrate electrode 30 and/or the counter electrode 40 is high, it might be appropriate to use more than one contact means 60 to achieve a more homogenous current distribution over the counter electrode area resulting in a more homogeneous generation of artificial light by the electroluminescent device 10. Examples for improved current distribution might by four contact means arranged in the middle of each side or arranged at the four corners of the counter electrode.

In all figures the connection 92, 93 of the electrodes 30, 40 have the form of a wire attached to the substrate electrode 20 or the contact means 60. This should just symbolize the possibility to connect the electrodes 30, 40 with the electrical source. Obviously the shown embodiments of the connections 92, 93 are just an exemplary design of such connections 92, 93. Other arrangements known to a person skilled in the art can also be used to connect the electrodes 30, 40 to an electrical source.

Figure 3:
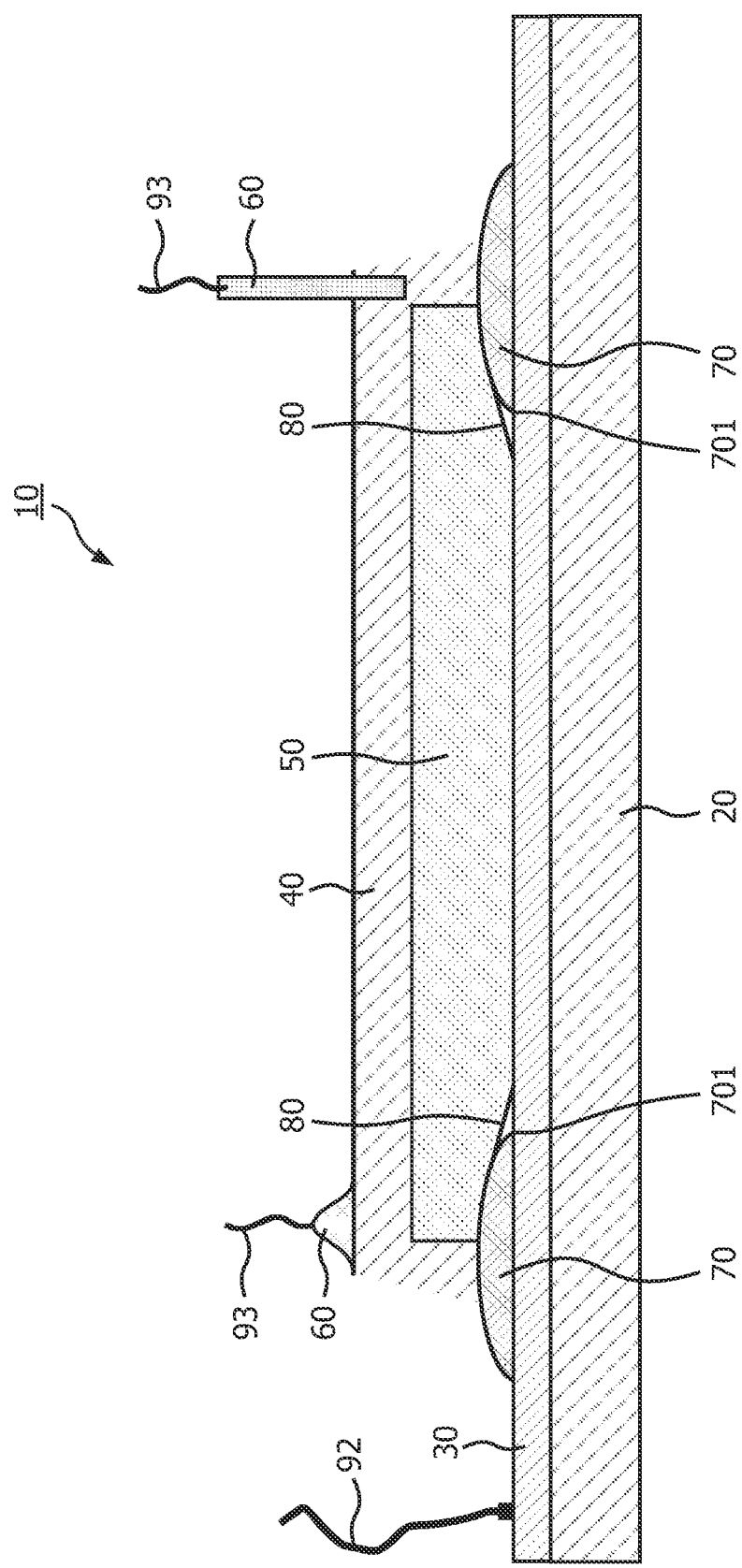
FIG. 3: electroluminescent device of FIG. 1 with a smoothing layer as a rim
Figure 4A:
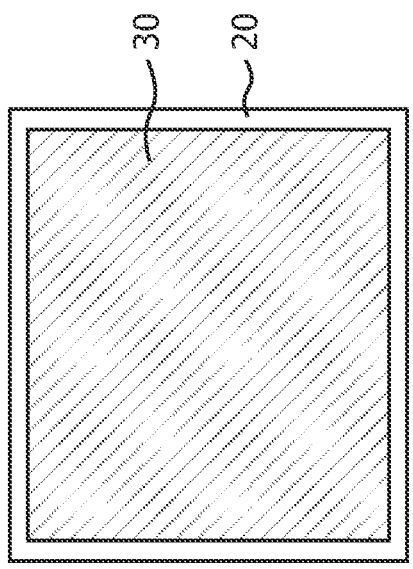
FIG. 4: manufacturing steps of the electroluminescent device of FIG. 1: (a) substrate electrode on substrate, (b) after applying the encapsulation means as a closed contour, (c) after applying the electroluminescent layer stack, and (d) electroluminescent device with contacted electrodes
Figure 4B:
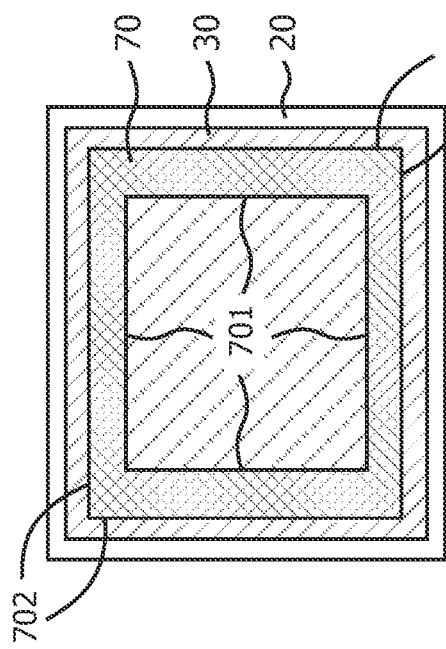
Figure 4C:
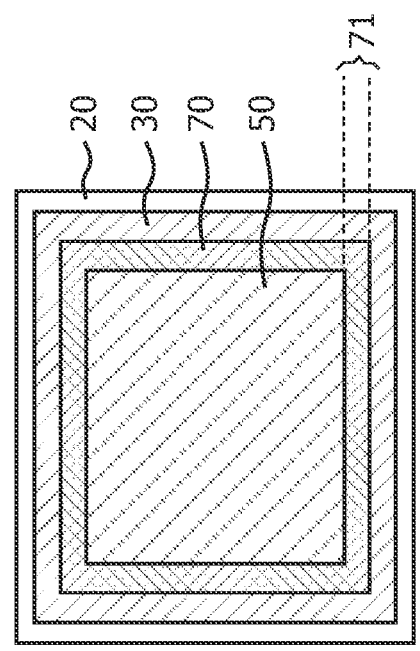
Figure 4D:
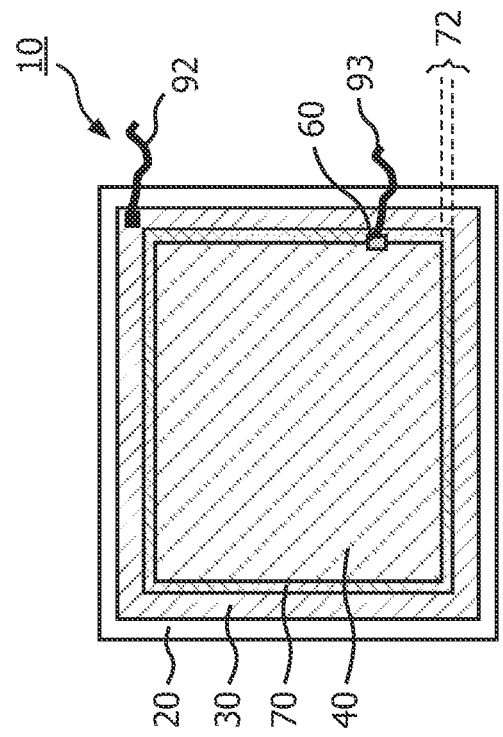

FIG. 3 shows an embodiment of the electroluminescent device 10 as shown in FIG. 1 with an added smoothing layer 80 partly covering the substrate electrode 30 and the closed contour of the encapsulation means 70. The smoothing layer smoothes out the eventually present steep inner edge 701 in order to prevent the emergence of shadowing edges during the deposition of the layers 50, 40 on top of the substrate electrode 30. The smoothing layer 80 is arranged as a rim on top of the substrate electrode 30 partly covering the contour of the encapsulation means 70, preferably covering only a small area around the inner edge 701 of the contour of the encapsulation means 70. The majority of the area within the closed contour is not covered by the smoothing layer 80. Here the smoothing layer 80 could either by conductive or non-conductive. In the latter case, there will be no charge injection into the electroluminescent layer from the areas of substrate electrode, which are covered by the smoothing layer 80, leading to a black appearance of the areas covered with the smoothing layer. However, if the material of the non-conductive smoothing layer 80 is transparent, it is possible to add scattering particles to this material in order to scatter light trapped with the substrate and/or electroluminescent layer stack to a forward direction to be emitted from the electroluminescent device. As an example in FIG. 3, the contact means on the right side is arranged as a pin penetrating parts of the counter electrode to establish an electrical contact.

FIG. 4 schematically shows the manufacturing process of an electroluminescent device according to our present invention First, the substrate 20 is covered by a contiguous electrode to be operated as the substrate electrode 30 in the electroluminescent device 10. For state of the art substrates, a glass substrate is covered with a transparent ITO layer prepared by sputtering. In the following step, the encapsulation means 70 is deposited on top of the substrate electrode 30 as a closed contour limiting the light emitting area to the area inside the closed contour. The contour preferably has a width parallel to the substrate electrode 30 of 0.5 mm, more preferred 1.0 mm, even more preferred of 2.0 mm in order to provide a sufficient side encapsulation of the electroluminescent device 10. Depending on the material used for the encapsulation means, the application method varies. Glass frit is mixed with a liquid like e.g. alcohol to obtain a paste, which can applied by screen printing techniques to the substrate. After drying, the glass frit is rapidly sintered by a laser beam. Metal layers are evaporated or sputtered to obtain a closed contour and then are anodized to obtain a dense, isolating oxide layer on top. Suitable metals comprise Al, Zr, Ti. Vacuum sealants are applied by e.g. screen printing and fired at about 300° C. for up to one hour to cure the layers. Smoothing layers at the inner rim of the encapsulation means can be applied in the form of a thin rim consisting of e.g. two-component glue, which is cured at temperatures between 100° C. and 200° C., depending on the type of glue.

During the next step, the electroluminescent layer stack 50 is deposited on top of the substrate electrode 30 and partly on top of the encapsulation means 70 forming a first gap 71. The size of the gap must smaller than the width of the contour 70 in order to guarantee a full coverage of the substrate electrode 30 by the electroluminescent layer stack 50. However, the first gap has to be large enough to enable a full coverage of the electroluminescent layer by the counter electrode deposited onto the electroluminescent layer in step (d). The resulting second gap 72 smaller than the first gap 71 must be large enough to obtain a sufficient electrical isolation between substrate electrode 30 and counter electrode 40 to the outer edge 702 of the contour 70. After depositing the counter electrode 40, the electrodes may be connected to the power source via contact means 60 a conductive paths 92, 93. The shown electrical connection is only one possible embodiment of electrical connection. The electroluminescent device 10 with side encapsulation 70 could alternatively be connected with a power source by conventionally structuring the electrode on top of the substrate 20 into two separate areas, one acting as the substrate electrode, the other one acting as a contacting area for the counter electrode 40 with a conductive thin film stripe bridging the gap between counter electrode and second contact area across the encapsulation means 70 locally.

According to the state of the art, organic layers and the counter electrode are deposited by vacuum evaporation.

FIG. 5 shows two embodiments of an electroluminescent device 10 according to the present invention with strengthened encapsulation on the backside of the electroluminescent device. In embodiment (a) the thickness of the counter electrode is strongly increased. This could either by achieved by an increasing the depositing time and/or increasing the deposition rate of the deposition process of the counter electrode or by an electroplating processes leading to a thickened counter electrode 100, where similar or even thicker counter electrodes can be achieved with shorter process times. An alternative embodiment to strengthen the encapsulation on the backside of the electroluminescent device is shown in embodiment (b) where an additional diffusion barrier 110 is applied on top of the counter electrode 40. These diffusion barriers might be single layers or layer stacks preventing the diffusion of oxygen and/or water through these diffusion barriers. People skilled in the art will choose suitable diffusion barriers within the scope of this invention.

The contact means to contact the counter electrode to a power source might be applied before strengthening the encapsulation from the backside (as in case (b)) or after strengthening the encapsulation from the backside (as in case (a)), depending on the strengthening process applied.

The described embodiments comprise as an example an organic electroluminescent layer 50 within the layer stack. In alternative embodiments within the scope of this invention, the electroluminescent layer stack may comprise layers additional to organic electroluminescent layer 50 such as hole transport layers, hole blocking layers, electron transport layers, electron blocking layers, charge injection layers further conducting layers etc.

LIST OF NUMERALS 10 electroluminescent device
20 substrate
30 substrate electrode
40 counter electrode
50 electroluminescent layer stack, here organic electroluminescent layer
60 contact means
70 encapsulation means
701 inner edge of the contour as the encapsulation means
702 outer edge of the contour as the encapsulation means
71 first gap
72 second gap
73 side encapsulation
80 smoothing layer as a rim
92 electrical connection substrate electrode—power source
93 electrical connection counter electrode—power source
100 thickened counter electrode
110 diffusion barrier

The invention claimed is:

1. An electroluminescent device comprising:
a substrate and on top of the substrate a substrate electrode, a counter electrode and an electroluminescent layer stack with at least one organic electroluminescent layer to emit light arranged between the substrate electrode and the counter electrode; and an electrically non-conducting encapsulation means arranged on the substrate electrode as a closed first contour having an inner edge and an outer edge framing the electroluminescent layer stack, wherein the electroluminescent layer stack at least covers an area on top of the substrate electrode defined by the inner edge of the first contour and establishing a contiguous first gap between the outer edge of the first contour and an edge of the electroluminescent layer stack, wherein the counter electrode is disposed above the entire electroluminescent layer stack establishing a contiguous second gap between the outer edge of the first contour and an edge of the counter electrode smaller than the first gap and sufficiently large to isolate the counter electrode from the substrate electrode, wherein a surface of the substrate electrode extends beyond the outer edge of the first contour such that said surface of the substrate electrode forms a closed second contour that surrounds the counter electrode and wherein said surface of the substrate electrode covers an area on top of the substrate defined entirely by an outer edge of said second contour;

wherein at least a portion of said electroluminescent layer stack is disposed above a top portion of said encapsulation means, and wherein the encapsulation means is suitable to act as a diffusion barrier layer in order to provide a side encapsulation of the electroluminescent layer stack.

2. The electroluminescent device according to claim 1, wherein the encapsulation means comprises at least one material selected from the group consisting of: SiO, $SiO_2$, $TiO_2$, nitrides, fluorides, glass, re-melted glass frits, UHV lacquer, and oxidized metal.

3. The electroluminescent device according to claim 1, wherein a smoothing layer is arranged on top of the substrate electrode covering at least the inner edge of the first contour to smooth the inner edge of the first contour.

4. The electroluminescent device according to claim 3, wherein the smoothing layer is arranged at the inner edge of the first contour as a rim with a width that is smaller than a width of the encapsulation means in a direction parallel to the substrate electrode.

5. The electroluminescent device according to claim 3, wherein the smoothing layer comprises at least one electrically non-conducting material.

6. The electroluminescent device according to claim 1, wherein at least one contact means is arranged on top of the encapsulation means at a location where the encapsulation means is at least partly covered with the counter electrode in order to establish an electrical connection between the counter electrode and a power source.

7. The electroluminescent device according to claim 6, wherein the contact means comprises at least one material selected from the group consisting of conductive glue, conductive lacquer, conductive paint, and conductive ink.

8. The electroluminescent device according to claim 1, wherein the counter electrode is encapsulated with a diffusion barrier.

9. A method for manufacturing an electroluminescent device comprising the steps of:

depositing a substrate electrode on top of a substrate, depositing a closed first contour with an inner edge and an outer edge as an encapsulation means on top of the substrate electrode;

depositing an electroluminescent layer stack on top of the substrate electrode fully covering an area on top of the substrate electrode defined by the inner edge of the first contour and establishing a contiguous first gap between the outer edge of the first contour and an edge of the electroluminescent layer stack; and depositing a counter electrode above the entire electroluminescent layer stack establishing a contiguous second gap between the outer edge of the first contour and an edge of the counter electrode smaller than the first gap isolating the counter electrode from the substrate electrode, wherein at least a portion of said electroluminescent layer stack is disposed above a top portion of said encapsulation means subsequent to the depositing of the counter electrode, wherein a surface of the substrate electrode extends beyond the outer edge of the first contour such that said surface of the substrate electrode forms a closed second contour that surrounds the counter electrode and wherein said surface of the substrate electrode covers an area on top of the substrate defined entirely by an outer edge of said second contour.

10. Method according claim 9, wherein the method further comprises the step of depositing a smoothing layer on top of the substrate electrode at least covering the inner edge of the first contour to smooth the inner edge of the first contour, wherein the smoothing layer is a rim with a width that is smaller than a width of the encapsulation means in a direction parallel to the substrate electrode.

11. Method according to claim 9, further comprising the step of applying a contact means on top of the encapsulation means at a location where the encapsulation means was previously at least partly covered with the counter electrode.

12. Method according to claim 9, further comprising the step of strengthening encapsulation properties of the counter electrode by thickening the counter electrode or by applying diffusion barriers on top of the counter electrode.

13. The electroluminescent device according to claim 1, wherein said top portion of said encapsulation means is a first top portion and wherein at least a portion of the counter electrode is disposed above a second top portion of said encapsulation means.

14. The electroluminescent device according to claim 13, wherein said at least a portion of said electroluminescent layer stack coats the first top portion of said encapsulation means and wherein said at least a portion of the counter electrode coats the second top portion of said encapsulation means.

15. The electroluminescent device according to claim 13, wherein said at least a portion of the counter electrode and said encapsulation means provide the diffusion barrier layer on a side of said electroluminescent layer stack.

16. Method according claim 9, wherein said top portion of said encapsulation means is a first top portion and wherein at least a portion of the counter electrode is disposed above a second top portion of said encapsulation means.

17. Method according claim 16, wherein said at least a portion of said electroluminescent layer stack coats the first top portion of said encapsulation means and wherein said at least a portion of the counter electrode coats the second top portion of said encapsulation means.

18. Method according claim 16, wherein said at least a portion of the counter electrode and said encapsulation means provide a diffusion barrier on a side of said electroluminescent layer stack.

19. The electroluminescent device according to claim 1, wherein at least one contact means is arranged on top of a portion; of said surface of the substrate electrode, that is disposed outside the first contour.

20. Method according to claim 9, further comprising the step of applying a contact means on top of a portion, of said surface of the substrate electrode, that is disposed outside the first contour.

* * * * *